(12) United States Patent
Garvin et al.

(10) Patent No.: US 10,715,161 B1
(45) Date of Patent: Jul. 14, 2020

(54) ANALOG-TO-DIGITAL CONVERTERS WITH RESISTOR DIGITAL-TO-ANALOG CONVERTERS FOR REFERENCE VOLTAGE TUNING

(71) Applicant: GLOBALFOUNDRIES Inc., Grand Cayman (KY)

(72) Inventors: Stacy Garvin, Durham, NC (US); John Rankin, Raleigh, NC (US); John Bulzacchelli, Somers, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/550,999

(22) Filed: Aug. 26, 2019

(51) Int. Cl.
  *H03M 1/06* (2006.01)
  *H03M 1/46* (2006.01)
  *H03M 1/66* (2006.01)

(52) U.S. Cl.
  CPC ............. *H03M 1/069* (2013.01); *H03M 1/46* (2013.01); *H03M 1/66* (2013.01)

(58) Field of Classification Search
  CPC ........... H03M 1/069; H03M 1/66; H03M 1/46
  USPC .......................................... 341/120, 144, 119
  See application file for complete search history.

(56) References Cited

U.S. PATENT DOCUMENTS

| | | | |
|---|---|---|---|
| 6,130,635 A * | 10/2000 | Jones, III | H03M 1/06 341/154 |
| 7,271,758 B2 | 9/2007 | Piasecki et al. | |
| 7,688,240 B2 * | 3/2010 | Jain | H03M 1/1028 341/120 |
| 7,710,302 B2 | 5/2010 | Iadanza et al. | |
| 8,436,677 B2 | 5/2013 | Kull et al. | |
| 8,547,270 B1 | 10/2013 | Strode | |
| 8,847,811 B2 * | 9/2014 | Wong | H03M 1/125 341/155 |

OTHER PUBLICATIONS

J. Fang et al., "A 5-GS/s 10-b 76-mW Time-Interleaved SAR ADC in 28 nm CMOS," in IEEE Transactions on Circuits and Systems I: Regular Papers, vol. 64, No. 7, pp. 1673-1683, Jul. 2017.

* cited by examiner

*Primary Examiner* — Brian K Young
(74) *Attorney, Agent, or Firm* — Thompson Hine LLP; David Cain (57) ABSTRACT

Circuits for an analog-to-digital converter and methods of operating an analog-to-digital converter. A resistor digital-to-analog converter (RDAC) has a first reference node coupled to a first current source, a second reference node coupled to a second current source, an input port configured to receive a first voltage, and an output port coupled to a buffer. The RDAC is configured to generate a second voltage including a first voltage shift from the first voltage and to supply the second voltage from the output port of the RDAC to the buffer.

19 Claims, 6 Drawing Sheets

ANALOG-TO-DIGITAL CONVERTERS WITH RESISTOR DIGITAL-TO-ANALOG CONVERTERS FOR REFERENCE VOLTAGE TUNING

BACKGROUND

The present invention generally relates to electrical circuits and, more specifically, to circuits for an analog-to-digital converter and methods of operating an analog-to-digital converter.

A successive approximation register (SAR) analog-to-digital converter (ADC) commonly employs a capacitive digital-to analog converter (CDAC) in which the constituent capacitors are switched between a reference voltage and ground to set an appropriate output voltage. Although an ideal CDAC outputs a reference voltage that is precisely linear, real-world CDACs are subject to influence by external factors, such as temperature, and are therefore susceptible to errors. For example, as temperature varies, the reference voltage output by the CDAC may drift and, accordingly, a gain error may be introduced.

A Time-Interleaved ADC may include a time-multiplexed parallel array of n identical successive approximation register (SAR) slices that increase the net sample rate, even though each individual slice in the array is actually sampling at a lower rate. Each SAR slice includes a buffer, such as a source follower, that has one or more transistors that provide a voltage drop relative to a stable reference voltage presented to its input. However, the output voltage may exhibit a significant temperature variation among the different SAR slices due to, for example, process variations among the transistors in the different SAR slices. The result is a temperature dependence that may cause different SAR slices to output different voltages despite receiving the same reference voltage.

Currently, the voltages of the different slices cannot be separately adjusted and calibrated. Such separate adjustments are desirable to provide a mechanism for compensating gain differences due to fabrication-related mismatches. Moreover, the separate adjustments should be enabled without adding to the temperature variations.

Accordingly, improved circuits for an analog-to-digital converter and methods of operating an analog-to-digital converter are needed.

SUMMARY

In an embodiment, a circuit for an analog-to-digital converter is provided. The circuit includes a resistor digital-to-analog converter (RDAC) having a first reference node coupled to a first current source, a second reference node coupled to a second current source, an input port configured to receive a first voltage, and an output port coupled to a buffer. The RDAC is configured to generate a second voltage that includes a first voltage shift from the first voltage and to supply the second voltage from the output port of the RDAC to the buffer.

In an embodiment, a method of operating an analog-to-digital converter is provided. The method includes distributing a first voltage to an input port of a resistor digital-to-analog converter (RDAC) that has been calibrated to provide a voltage shift. The method further includes generating, by the RDAC, a second voltage that includes the voltage shift from the first voltage, and supplying the second voltage from an output port of the RDAC to a buffer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
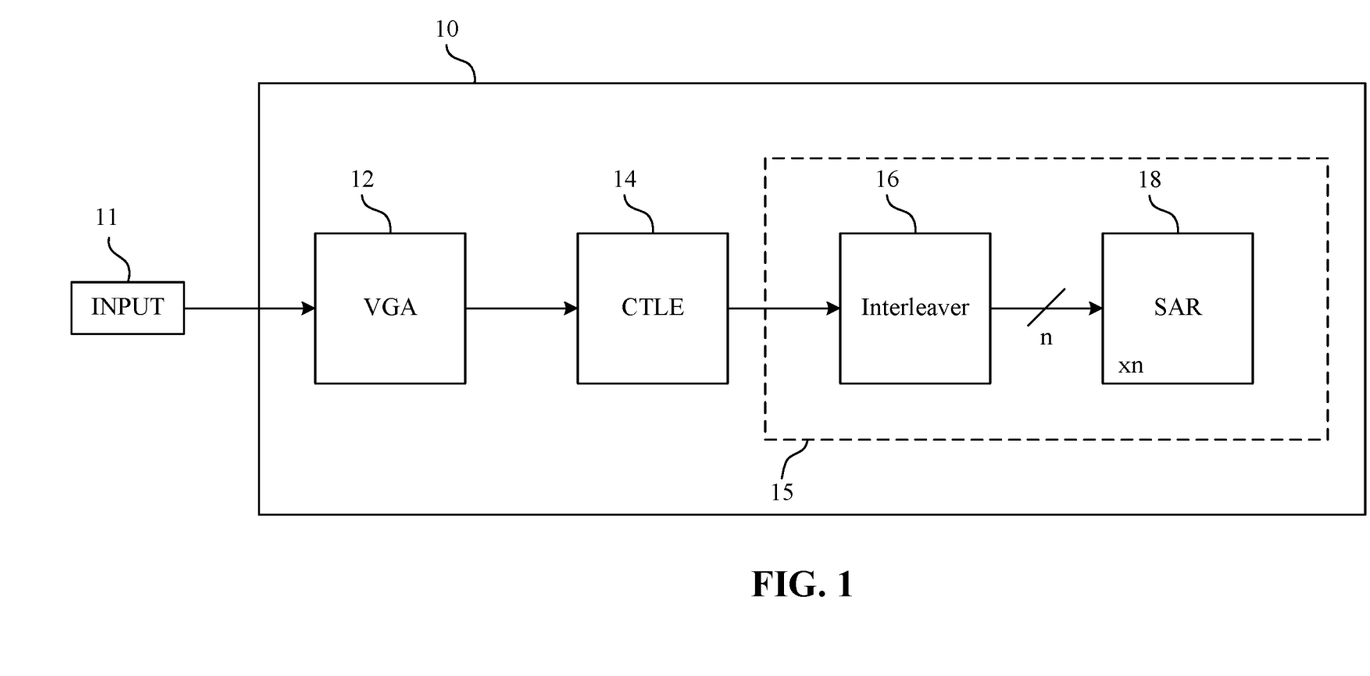
FIG. 1 is a circuit diagram of an exemplary receiver circuit that includes an analog-to-digital converter in accordance with embodiments of the invention.

With reference to FIG. 1, a receiver circuit 10 may include an analog-to-digital converter (ADC) 15 that is configured to sample analog input signals and to convert the analog input signals into digital outputs. The ADC 15 may be configured with sufficient resolution to provide digital outputs that closely represent the analog input signals. For example, the ADC 15 may be configured to convert a continuous analog waveform into a discrete digital representation via a binary search through multiple possible quantization levels before converging upon a digital output for each conversion. Through the process of time interleaving identical successive approximation register (SAR) slices, the ADC 15 may be configured to process sample data at a faster rate than the operating sample rate of each individual SAR slice. To that end, the ADC 15 may include a time-multiplexed parallel array of n identical SAR slices of a successive approximation register (SAR) 18 to achieve a higher net sample rate, even though each individual SAR slice in the array is actually sampling at a lower rate. The number of SAR slices in the array may be thirty-two (32), sixty-four (64), one hundred twenty-eight (128), etc.

As shown in FIG. 1, analog input signals may be provided as an input 11 from a signal source to a variable-gain amplifier (VGA) 12. The VGA 12 may provide signal conditioning with an electronically-settable voltage gain. In order to avoid issues resulting from gain temperature variation of the SAR 18, the receiver circuit 10 may compensate for gain temperature variation by varying the electronically-settable voltage gain of the VGA 12 based on temperature. The receiver circuit 10 may supply the output of VGA 12 to an equalizer circuit in the representative form of a continuous-time linear equalizer (CTLE) 14. The CTLE 14 provides signal conditioning in the form of equalization that may restore balance between the various frequency components of the signal received from the VGA 12. An interleaver 16 may sample an output of the CTLE 14 and provide lower frequency samples to each of the n-number of SAR slices of the SAR 18. The interleaver 16 implements time interleaving which permits the ADC 15 to process signals received as the input 11 at the faster rate in a time-sequenced manner by leveraging the multiple slices of the SAR 18. The signals are effectively quantized and separately processed by the slices of the SAR 18, and digital circuitry (not shown) subsequently interleaves the B bit samples of each of the n-number of SAR slices into one B bit stream, representing a B bit digital code at the sampling rate of the ADC 15.

Figure 2:
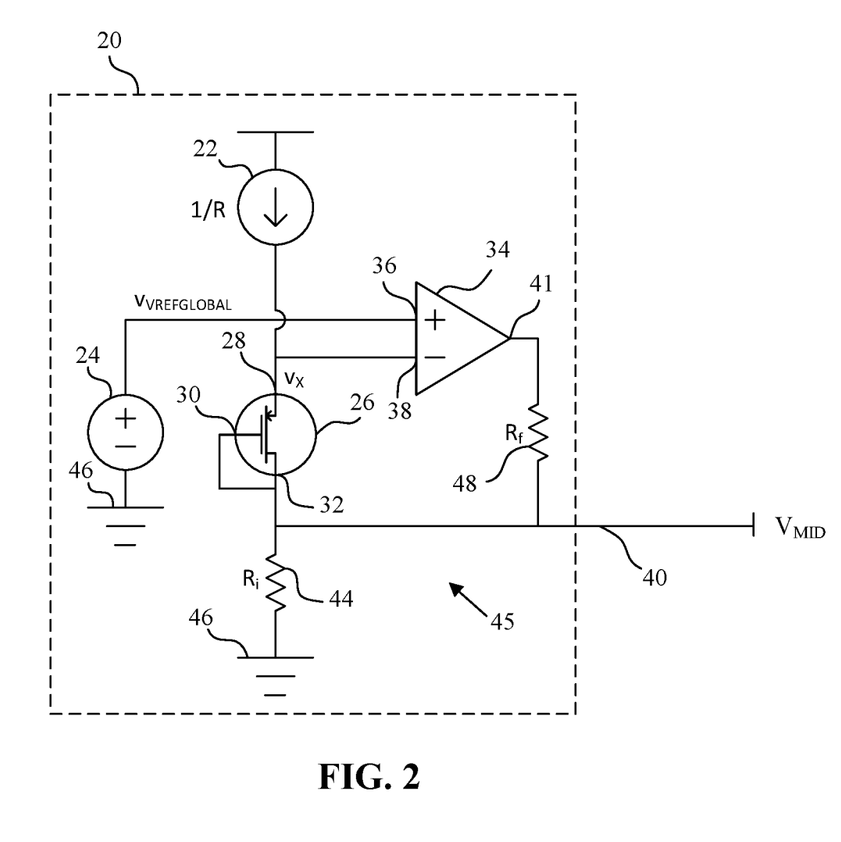
FIG. 2 is a circuit diagram of a voltage reference circuit of an analog-to-digital converter in accordance with embodiments of the invention.
Figure 3:
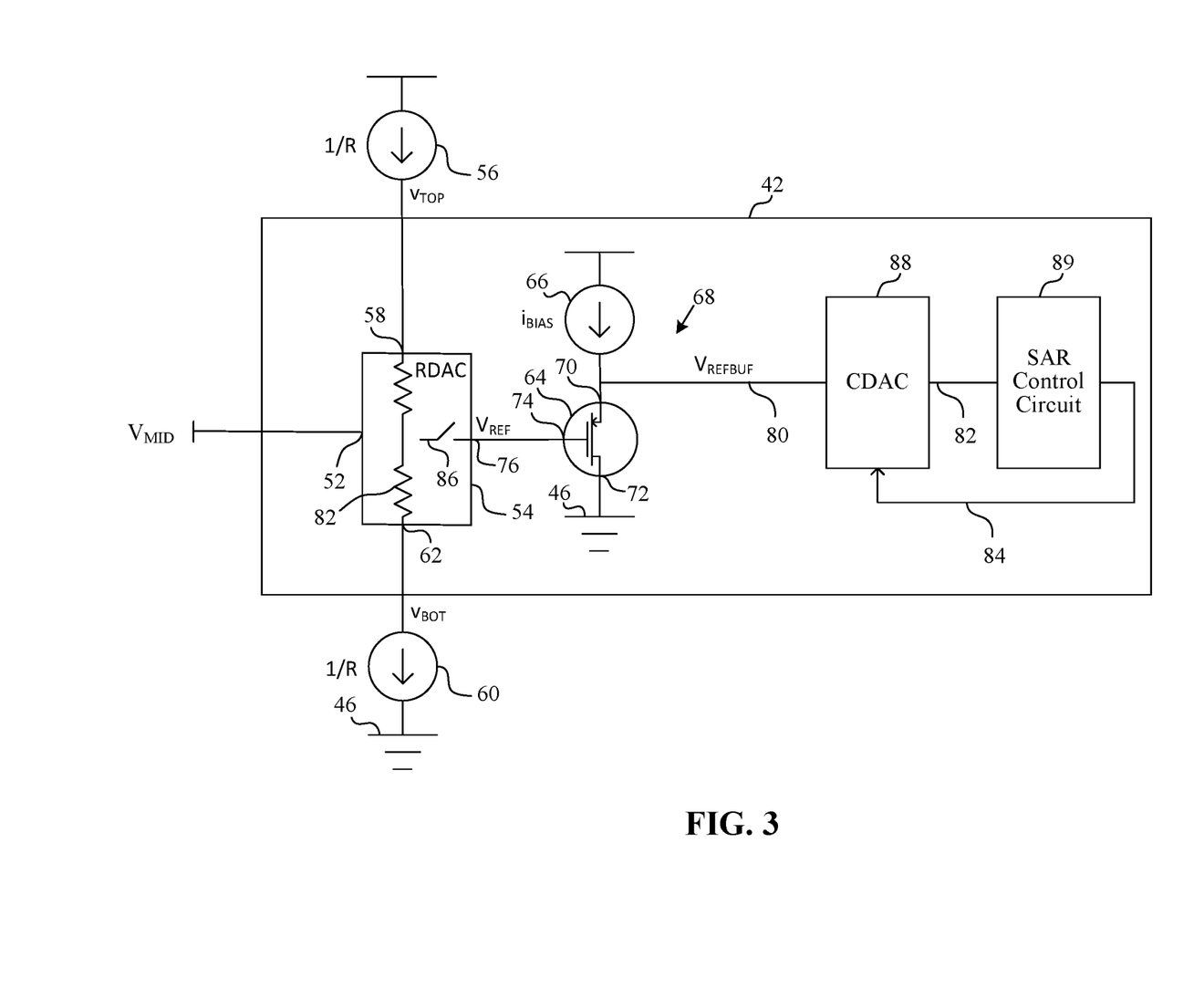
FIG. 3 is a circuit diagram of an embodiment of an SAR slice.
Figure 4:
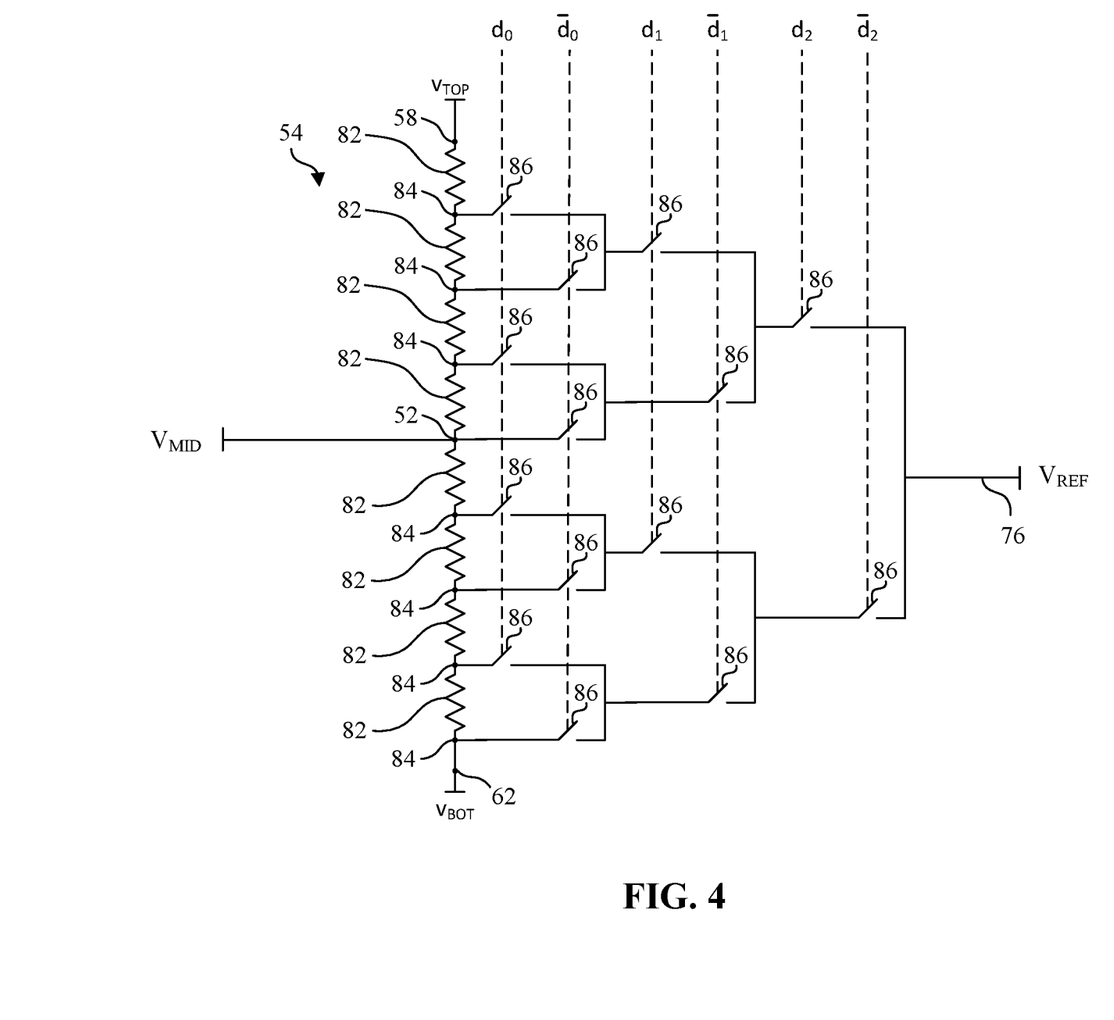
FIG. 4 is a circuit diagram of an embodiment of the resistive digital-to-analog converter of FIG. 3.

With reference to FIGS. 2-4 and in accordance with embodiments of the invention, the ADC 15 (FIG. 1) may include a global reference circuit 20 that has a transistor 26, operational amplifier 34, and a voltage divider 45. The transistor 26 may be a p-type field-effect transistor having a source 28 coupled to a current source 22, a drain 32, and a gate 30. The gate 30 of the transistor 26 may be coupled to the drain 32 of the transistor 26 such that the transistor 26 is diode-connected. In an embodiment, the current source 22 may be a constant current source, such as a 1/R bandgap current reference. The operational amplifier 34 may have a non-inverting input 36 that is coupled to a constant reference voltage source 24 that supplies a constant reference voltage ($V_{REFGLOBAL}$). The operational amplifier 34 may have an inverting input 38 that is coupled to the source 28 of the transistor 26. The feedback loop of the operational amplifier 34 regulates the gate voltage of the transistor 26. The voltage divider 45 includes a resistor 44 that is coupled between the drain 32 of the transistor 26 and ground 46. The voltage divider 45 also includes a resistor 48 coupled to the output 41 of the operational amplifier 34 and to the drain 32 of the transistor 26. The global reference circuit 20 is configured to generate a reference voltage ($V_{MID}$) that is output at the output 40 of the global reference circuit 20.

The output 40 of the global reference circuit 20 may be coupled in parallel to each of a number of successive approximation register (SAR) slices 42 (e.g., the n slices of SAR 18 (FIG. 1)). The reference voltage ($V_{MID}$) generated by the global reference circuit 20 of the ADC 15 is therefore distributed in parallel to each of the SAR slices 42 of the ADC 15. However, a voltage is not provided as feedback from any of the SAR slices 42 to either of the inputs 36, 38 of the operational amplifier 34.

Each SAR slice 42 may include a resistor digital-to-analog converter (RDAC) 54 and a buffer 68 that is coupled to the RDAC 54. The RDAC 54 includes multiple resistors 82 that each have a fixed resistance value and that are arranged in a network, as a well as multiple switches 86 that are controlled to change the resistance value of the RDAC 54. In an embodiment, the resistors 82 may have nominally equal resistance values. The RDAC 54 of each SAR slice 42 has a center tap or input port 52 that represents an input to the SAR slice 42. The input port 52 is coupled with the output 40 of the global reference circuit 20, and each SAR slice 42 receives the reference voltage ($V_{MID}$) from the output 40 of the global reference circuit 20 at the input port 52. The RDAC 54 may be center-tapped at the input port 52 such that the number of resistors 82 arranged between the input port 52 and the reference node 58 in an upper half of the resistor string is nominally equal to the number of resistors 82 arranged between the input port 52 and the reference node 62 in a lower half of the resistor string. A current source 56 may be coupled to a reference node 58 of the RDAC 54 of each SAR slice 42, and another current source 60 may be coupled to a reference node 62 of the RDAC 54 of each SAR slice 42. The resistors 82 generate ohmic (IR) voltage drops such that the current source 56 drives the upper half of the resistor string to a voltage ($V_{TOP}$) and the current source 60 drives the lower half of the resistor string to a voltage ($V_{BOT}$). In an embodiment, the current source 60 may be an equivalent of the current source 56 such that negligible, and ideally zero, current flows into the input port 52 from the SAR slice 42. In an embodiment, the current sources 56 and 60 may be constant current sources, such as 1/R bandgap current reference sources, such that the voltage drop across each resistor 82 is stable and constant. In an embodiment, the current sources 56 and 60 may be shared by all of the SAR slices 42 in which case the connections with the current sources 56 and 60 are shared nodes between all SAR slices 42, similar to the connection between the SAR slices 42 and the global reference circuit 20.

The reference voltage ($V_{MID}$) provided from the global reference circuit 20 to each SAR slice 42 may be adjusted by the RDAC 54 before being supplied as a reference voltage ($V_{REF}$) to the buffer 68. Specifically, an adjustment of the resistance of the RDAC 54 may effect a change in the voltage that is transferred to the buffer 68. Furthermore, the biasing of each RDAC 54 by the current sources 56 and 60 may provide constant currents in order to maintain a constant voltage drop across each RDAC 54, which may produce a well-defined level shift from the reference voltage ($V_{MID}$) received at the input port 52 according to the resistance value of the RDAC 54. In an embodiment, the switches 86 of the RDAC 54 of each SAR slice 42 are configured to be independently controlled such that the output voltage of each RDAC 54 can be individually set to a specific value. The voltage shift for the RDAC 54 of each SAR slice 42 is independent of a value or magnitude of the reference voltage ($V_{MID}$).

The buffer 68 of each SAR slice 42 may have an input and an output with a low output resistance, and that level-shifts the input voltage at the output port. The buffer 68 of each of the parallel SAR slices 42 of the SAR 18 may generate an analog voltage at its output port based on the voltage received at its input port 52. In an embodiment, the buffer 68 may be a source follower buffer that includes a current source 66 and a transistor 64. The transistor 64 may be a p-type field effect transistor, and the current source 66 may be coupled to a source 70 of the transistor 64, a drain 72 of the transistor 64 may be coupled to ground 46, and a gate 74 of the transistor 64 may be coupled to the output port 76 of the RDAC 54 in order to receive the reference voltage ($V_{REF}$) output from the RDAC 54.

A reference voltage ($V_{REF}$) may be presented from the output port 76 of the RDAC 54 to the input of the buffer 68. The voltage ($V_{REFBUF}$) at the output 80 of the buffer 68 may be a gate-to-source voltage drop above the reference voltage ($V_{REF}$). Given that the voltage from the gate 74 to the source 70 of the transistor 64 may be temperature dependent due to temperature-dependent factors such as threshold voltage and mobility, $V_{REFBUF}$ of each SAR slice 42 may have a temperature variation (e.g., typically 70 mV from −10° C. to 125° C.) at the output 80. The threshold voltage of the transistor 26 in the global reference circuit 20 may compensate in part for the temperature dependence of the transistor 64 in each buffer 68. In particular, the transistor 26 and each transistor 64 may be similarly biased such that their temperature coefficients of output voltage are substantially the same. However, the operation of the RDAC 54 may provide temperature independent voltage adjustments, allowing for each SAR slice 42 to use a reference voltage that is different than the global reference voltage but with the same temperature dependence. Thus, compensation for temperature-based deviation of threshold voltage of the transistor 64 may be combined with predictable delta voltage steps provided by the RDAC 54 that are not process corner dependent. The result is that the values of voltage ($V_{REFBUF}$) at the output 80 of the buffer 68 of the different slices 42 may be constant as a function of temperature and individually tunable to specific voltages on a per-slice basis.

Each of the SAR slices 42 of the SAR 18 may further include a capacitive digital-to-analog converter (CDAC) 88 and a SAR control circuit 89 that is coupled with the CDAC 88. The CDAC 88, which is further described in connection with FIG. 5, receives the reference voltage ($V_{REFBUF}$) from the output 80 of the buffer 68.

Figure 3A:
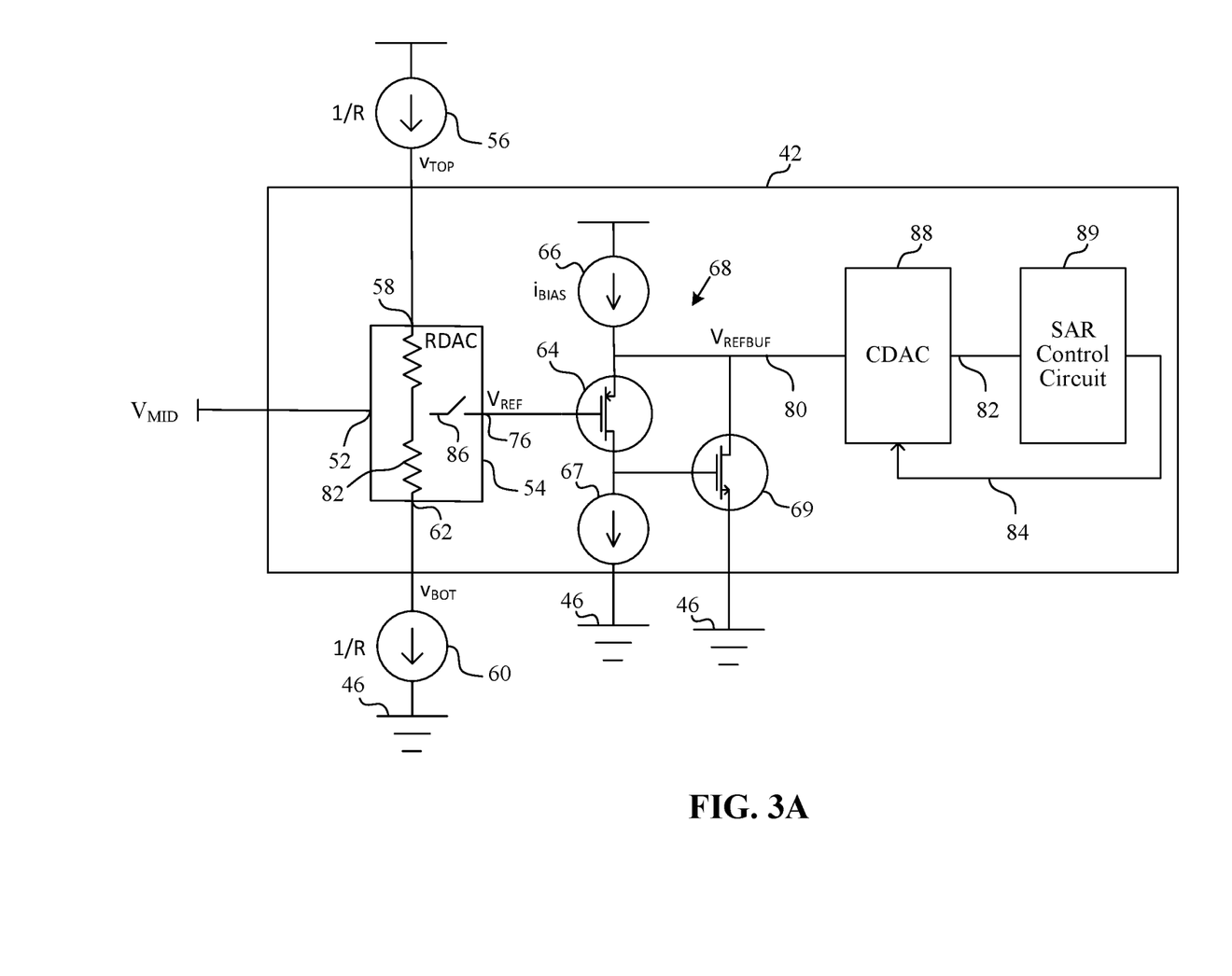
FIG. 3A is a circuit diagram of an alternative embodiment of the SAR slice.

In an alternative embodiment and as shown in FIG. 3A, the buffer 68 may be a super source follower that includes another transistor 69 and another current source 67. The transistor 69 may be an n-type field-effect transistor having a gate coupled to the drain of the transistor 64, a source coupled to ground 46, and a drain coupled with the output 80. The drain of the transistor 64 is coupled with the current source 67.

As best shown in FIG. 4, the RDAC 54 may utilize a resistor-string architecture (e.g., a string DAC) having multiple of resistors 82 coupled in series with a node 84 between each of the resistors 82. For example, multiple switches 86 may be connected to one or more resistors 82 in order to provide a selectable resistance and associated voltage at the output port 76. The RDAC 54 has digital input codes (e.g., $d_0, d_1, d_2$) with complementary digital codes (e.g., $d_0, d_1, d_2$) providing an RDAC code which activates and controls the switches 86 to switch selected resistors 82 into a connection with the output port 76. The digital input codes supplied to the RDAC 54 adjusts the switches 86 to provide a fixed and temperature-independent voltage drop of above or below the reference voltage ($V_{MID}$). For example, when a full-scale code is applied, the topmost switches may close and the output (e.g., $V_{REF}$) may go to full scale (e.g., the full scale code of RDAC 54 may produce an output of $V_{TOP}$ minus 1 least significant bit). Likewise, when a zero scale code is applied, the bottommost switches 86 may close and the output (e.g., $V_{REF}$) may go to zero scale (e.g., the zero scale code of the RDAC 54 may produce an output of $V_{BOT}$). For example, every resistor 82 down the string or chain may create a voltage drop equal to 1 least significant bit. Moreover, there may be one resistor-switch pair for each code that can be applied to the RDAC 54. Because of this, as resolution increases, the number of resistors 82 and switches 86 in the design of the RDAC 54 may increase exponentially. Each of the resistors 82 may have a fixed resistance value and, therefore, each resistor 82 may produce a constant delta voltage. Accordingly, each RDAC step may be a constant voltage away from the voltage at the input port 52.

Each of the SAR slices 42 of the SAR 18 may be calibrated using a calibration algorithm. For example, the local RDAC 54 of each SAR slice 42 may be set to a nominal value by supplying a given RDAC code, the reference voltage ($V_{REFGLOBAL}$) may then be adjusted by sensing the output port 76 of each local RDAC 54 (e.g., $V_{REF}$) one by one (e.g., for 1 to n parallel SAR slices 42 of the SAR 18), and then the reference voltage ($V_{REFGLOBAL}$) may be set to an average of the output port 76 of each local RDAC 54. Alternatively, the reference voltage ($V_{REFGLOBAL}$) may be set at a nominal value, and individual RDACs may be used for calibration. Then the global reference voltage ($V_{REFGLOBAL}$) can be adjusted so that the local RDACs 54 are centered or to avoid them being railed. For example, the reference voltage ($V_{REFBUF}$) may be brought down by a preset number of least significant bits if railed ($V_{REF}$ equals $V_{TOP}$), or the maximum and minimum of the output port 76 of each local RDAC 54 may be adjusted to output a minimum deviation from the voltage ($V_{MID}$) at the center tap.

Figure 5:
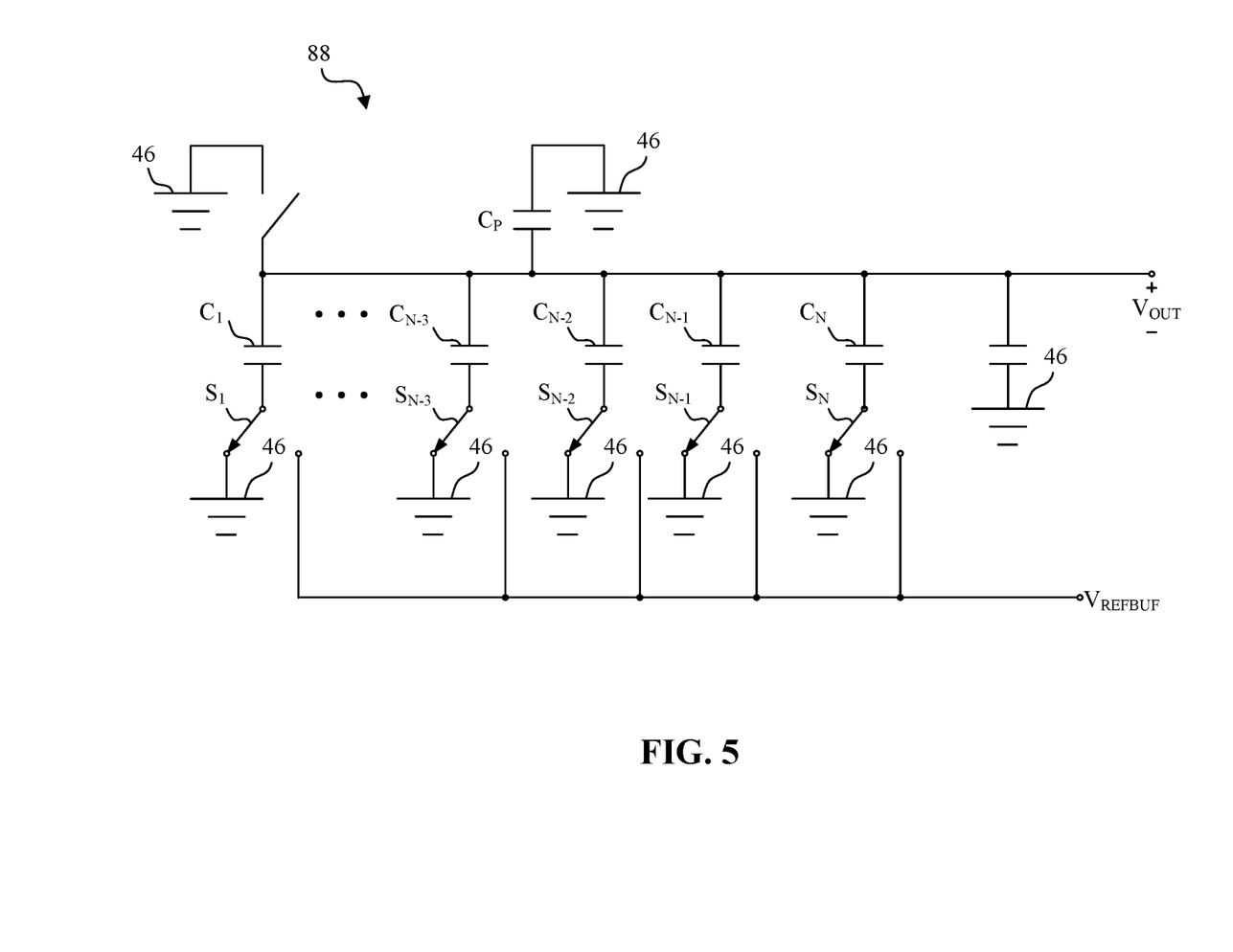
FIG. 5 is a circuit diagram of an embodiment of the capacitive digital-to-analog converter of FIG. 3.

With reference to FIG. 5, each slice 42 of the SAR 18 may include a capacitive digital-to-analog converter (CDAC) 88 that functions based on charge redistribution. The CDAC 88 includes capacitors $C_1, \ldots, C_{N-3}, C_{N-2}, C_{N-1}$, and $C_N$ that are switched between the voltage ($V_{REFBUF}$) and ground through switches $S_1, \ldots, S_{N-3}, S_{N-2}, S_{N-1}$, and $S_N$. The capacitors $C_1, \ldots, C_{N-3}, C_{N-2}, C_{N-1}$, and $C_N$ are switched to set the appropriate output voltage $V_{OUT}$. The step size of the CDAC output voltage is set by the capacitor ratios and reference voltage ($V_{REFBUF}$). The DAC gain is defined as the slope of the curve of CDAC Analog out vs. Digital in. Charge redistribution on the capacitors $C_1, \ldots, C_{N-3}, C_{N-2}, C_{N-1}$, and $C_N$ causes current to be drawn from or sunk by the positive reference voltage ($V_{REFBUF}$). The capacitance of the capacitors $C_1, \ldots, C_{N-3}, C_{N-2}, C_{N-1}$, and $C_N$ is affected by ambient temperature, though its effect on CDAC step size is minimal due to it being a function of capacitor ratios. The voltage ($V_{REFBUF}$) may be affected by temperature drift. Because $V_{REFBUF}$ 80 in the CDAC 88 may vary with temperature, the gain of the CDAC 88 may move linearly with $V_{REFBUF}$. The gain of the CDAC 88 directly affects the gain of the ADC 15. Thus, the gain variation experienced by the ADC 15 may occur in an environment in which the voltage represented by $V_{REFBUF}$ has temperature drift.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit for an analog-to-digital converter, the circuit comprising:
   a first current source;
   a second current source;

a first buffer, and a first resistor digital-to-analog converter (RDAC) having a first reference node coupled to the first current source, a second reference node coupled to the second current source, an input port configured to receive a first voltage, and an output port coupled to the first buffer, wherein the first RDAC is configured to generate a second voltage that includes a first voltage shift from the first voltage and to supply the second voltage from the output port of the first RDAC to the first buffer.

2. The circuit of claim 1 wherein the first RDAC includes a first plurality of resistors and a second plurality of resistors, and the input port of the first RDAC is center-tapped between the first plurality of resistors and the second plurality of resistors.

3. The circuit of claim 2 wherein the first plurality of resistors are arranged in a first string between the first reference node and the input port, and the second plurality of resistors are arranged in a second string between the second reference node and the input port.

4. The circuit of claim 1 wherein the first buffer includes a transistor having a gate, and the output port of the first RDAC is coupled to the gate of the transistor.

5. The circuit of claim 1 wherein the first RDAC includes a plurality of resistors and a plurality of switches, and the switches are configured to selectively connect one or more of the resistors with the output port to generate the first voltage shift.

6. The circuit of claim 5 wherein the first RDAC is configured to respond to an n-bit digital input signal to control the switches of the first RDAC.

7. The circuit of claim 1 further comprising:

a global reference circuit including an output that is coupled with the input port of the first RDAC, the global reference circuit configured to generate the first voltage.

8. The circuit of claim 7 wherein the global reference circuit includes a transistor and an operational amplifier, the transistor includes a drain and a gate coupled to the drain, and the operational amplifier includes an inverting input coupled to a source of the transistor, and further comprising:

a third current source; and a constant reference voltage source, wherein the source of the transistor is coupled to the third current source, and the operational amplifier includes a non-inverting input coupled to the constant reference voltage source.

9. The circuit of claim 8 wherein the operational amplifier has an output, and further comprising:

a voltage divider including a first resistor and a second resistor, the first resistor coupled between the output of the operational amplifier and the input port of the first RDAC, and the second resistor coupled between the drain of the transistor and ground.

10. The circuit of claim 1 wherein the first buffer and the first RDAC are included in a first successive approximation register slice.

11. The circuit of claim 10 further comprising:

a second successive approximation register slice including a second buffer and a second resistor digital-to-analog converter (RDAC), the second RDAC including an input port configured to receive the first voltage and an output port coupled to the second buffer, and the second RDAC configured to generate a third voltage that includes a second voltage shift from the first voltage and to supply the third voltage from the output port of the second RDAC to the second buffer.

12. The circuit of claim 11 wherein the second RDAC includes a first reference node coupled to the first current source and a second reference node coupled to the second current source.

13. The circuit of claim 11 further comprising:

a global reference circuit including an output that is coupled in parallel with the input port of the first RDAC and the input port of the second RDAC, wherein the global reference circuit is configured to generate the first voltage.

14. The circuit of claim 1 wherein the first current source and the second current source are constant current sources.

15. A method of operating an analog-to-digital converter, the method comprising:

distributing a first voltage to an input port of a first resistor digital-to-analog converter (RDAC) that has been calibrated to provide a first voltage shift;

generating, by the first RDAC, a second voltage that includes the first voltage shift from the first voltage; and supplying the second voltage from an output port of the first RDAC to a first buffer, wherein the first voltage shift is independent of a value of the first voltage.

16. The method of claim 15 wherein the first buffer includes a first transistor, and further comprising:

providing the second voltage from the output port of the first RDAC to a gate of the first transistor.

17. The method of claim 16 further comprising:

comparing a source voltage of a second transistor in a reference circuit with a constant reference voltage using an operational amplifier to generate the first voltage.

18. The method of claim 17 further comprising:

biasing the second transistor to compensate for a temperature dependence of the first transistor.

19. The method of claim 15 wherein the first voltage is distributed in parallel to an input port of a second resistor digital-to-analog converter (RDAC) that has been calibrated to provide a second voltage shift, and further comprising:

generating, by the second RDAC, a third voltage that includes the second voltage shift from the first voltage; and supplying the third voltage from an output port of the second RDAC to a second buffer.

* * * * *